(12) United States Patent
Zou et al.

(10) Patent No.: US 9,065,407 B2
(45) Date of Patent: Jun. 23, 2015

(54) HIGH SPEED TRANSIMPEDANCE AMPLIFIER

(71) Applicant: TM Technology Inc., Hsinchu (TW)

(72) Inventors: He-hong Zou, Westlake Village, CA (US); Chih-Yang Wang, Kaohsiung (TW)

(73) Assignee: TM Technology Inc., Science-Based Industrial Park, Hsinchu (TW)

( * ) Notice: Subject to any disclaimer, the term of this patent is extended or adjusted under 35 U.S.C. 154(b) by 57 days.

(21) Appl. No.: 13/862,488

(22) Filed: Apr. 15, 2013

(65) Prior Publication Data

US 2013/0271218 A1 Oct. 17, 2013

Related U.S. Application Data

(60) Provisional application No. 61/625,091, filed on Apr. 17, 2012.

(51) Int. Cl.
| | |
|---|---|
| *H03F 3/08* | (2006.01) |
| *H03G 3/00* | (2006.01) |
| *H03G 1/00* | (2006.01) |
| *H03F 3/38* | (2006.01) |

(52) U.S. Cl.
CPC ....... *H03G 3/004* (2013.01); *H03F 3/38* (2013.01); *H03G 1/0035* (2013.01); *H03G 1/007* (2013.01)

(58) Field of Classification Search
CPC .............. H03F 3/45475; H03F 2203/45528; H03F 2203/45138; H03F 1/34; H03F 3/087; H03F 3/45179; H03F 2200/294; H03F 2200/405; H03F 2203/45512; H03F 2203/45526; H03F 2203/45702; H03F 3/08; H03F 3/45183; H03F 2203/45318; H03F 2200/451; H03F 3/45636; H03F 3/45973; H03K 17/78
USPC .................. 330/59, 308; 250/214 A, 214 AG
See application file for complete search history.

(56) References Cited

U.S. PATENT DOCUMENTS

| | | | |
|---|---|---|---|
| 4,772,859 A | 9/1988 | Sakai | |
| 6,720,826 B2 * | 4/2004 | Yoon | 330/308 |

(Continued)

FOREIGN PATENT DOCUMENTS

TW   200726070   7/2007

OTHER PUBLICATIONS

Behzad Razavi, 2001, Design of Analog CMOS Integrated Circuits, p. 95, Fig. 3.67, McGraw-Hill.

*Primary Examiner* — Khanh V Nguyen
(74) *Attorney, Agent, or Firm* — Winston Hsu; Scott Margo

(57) ABSTRACT

A high speed transimpedance amplifier includes an inverting unit, at least one gain module, and a feedback resistor. The inverting unit has an input terminal coupled to a photodiode for receiving an input voltage, and an output terminal for outputting a first voltage. The at least one gain module has an input terminal coupled to the output terminal of the inverting unit for receiving the first voltage, and an output terminal for outputting an output voltage. Each gain module includes a first gain inverting unit and a second gain inverting unit which are coupled to each other. The first gain inverting unit and the second gain inverting unit dominate bandwidth of the high speed transimpedance amplifier. The feedback resistor is coupled to the input terminal of the inverting unit and the output terminal of the at least one gain module for determining a transimpedance of the high speed transimpedance amplifier.

11 Claims, 6 Drawing Sheets

(56) References Cited

U.S. PATENT DOCUMENTS

| | | | |
|---|---|---|---|
| 6,737,924 B1 * | 5/2004 | Paillet et al. | 330/308 |
| 6,828,857 B2 * | 12/2004 | Paillet et al. | 330/308 |
| 8,509,629 B2 * | 8/2013 | Zou et al. | 330/277 |
| 2009/0110409 A1 | 4/2009 | Zou | |

\* cited by examiner

HIGH SPEED TRANSIMPEDANCE AMPLIFIER

CROSS REFERENCE TO RELATED APPLICATIONS

This application claims the benefit of U.S. Provisional Application No. 61/625,091, filed on Apr. 17, 2012 and entitled "High Speed CMOS Gigabit Transimpedance Amplifier," the contents of which are incorporated herein by reference.

BACKGROUND OF THE INVENTION

1. Field of the Invention

The present invention relates to a high speed transimpedance amplifier, and particularly to a high speed transimpedance amplifier that can utilizes a resistive feedback characteristic to increase sensitivity of the high speed transimpedance amplifier, or decrease power consumption of the high speed transimpedance amplifier.

2. Description of the Prior Art

A transimpedance amplifier is an important component in a receiver of an optical communication system, where noise and bandwidth performance of the transimpedance amplifier can determine how far and how fast the optical communication system can reach. Please refer to FIG. 1. FIG. 1 is a diagram illustrating a transimpedance amplifier 100 according to the prior art. As shown in FIG. 1, the transimpedance amplifier 100 includes three identical inverters 102, 104, and 106, three diode-connected transistors LM1, LM2, and LM3, and a feedback resistor RF, where the transistors LM1, LM2, and LM3 are used for increasing bandwidth of the transimpedance amplifier 100, and a gain A of the transimpedance amplifier 100 can be determined by equation (1):

$$A = \frac{g_{mLM1}}{g_{mPM1} + g_{mNM1}} \times \frac{g_{mLM2}}{g_{mPM2} + g_{mNM2}} \times \frac{g_{mLM3}}{g_{mPM3} + g_{mNM3}} \quad (1)$$

As shown in equation (1), gmLMi, gmPMi, and gmNMi represent transconductances of transistors LMi, PMi, and NMi, respectively, where $1 \leq i \leq 3$, and i is a positive integer. Therefore, the transimpedance amplifier 100 utilizes gains of the inverters 102, 104, and 106 to obtain a high gain. As shown in FIG. 1, input impedance RIN and a transimpedance gain TZ of the transimpedance amplifier 100 (from an input current Iin to an output voltage VOUT) can be determined by equation (2) and equation (3), respectively:

$$RIN = \frac{RF}{A} \quad (2)$$

$$TZ = RF \quad (3)$$

If an input capacitor CIN includes a parasitic capacitor of a photodiode 108 and other parasitic capacitors of an input terminal of the transimpedance amplifier 100, 3-dB bandwidth $f_{3dB}$ of the transimpedance amplifier 100 can be determined by equation (4):

$$f_{3dB} = \frac{1}{2\pi \times RIN \times CIN} = \frac{A}{2\pi \times RF \times CIN} \quad (4)$$

In addition, input noise $I_{noise}$ of the transimpedance amplifier 100 can be determined by equation (5):

$$I_{noise} = \sqrt{\frac{4kT\Delta f}{RF}} \quad (5)$$

As shown in equation (5), T is an absolute temperature, k is the Boltzmann constant, and $\Delta f$ is bandwidth for a predetermined data transmission rate. In addition, it is noted that the input noise $I_{noise}$ of the transimpedance amplifier 100 is an indicator of sensitivity of the transimpedance amplifier 100. Therefore, the input noise $I_{noise}$ is smaller, the sensitivity of the transimpedance amplifier 100 is better.

Equation (4) and equation (5) can be regarded as a design guide of the transimpedance amplifier 100. Therefore, the gain A and the feedback resistor RF of the transimpedance amplifier 100 can determine the 3-dB bandwidth $f_{3dB}$ and the input noise $I_{noise}$ of the transimpedance amplifier 100 according to equation (4) and equation (5). However, because the gain A of the transimpedance amplifier 100 is limited to the three inverters 102, 104, and 106 (that is, the gain A of the transimpedance amplifier 100 generated by the three inverters 102, 104, and 106 is still not enough), the transimpedance amplifier 100 is not a good choice for a designer of the optical communication system.

SUMMARY OF THE INVENTION

An embodiment provides a high speed transimpedance amplifier. The high speed transimpedance amplifier includes an inverting unit, at least one gain module, and a feedback resistor. The inverting unit has an input terminal coupled to a photodiode for receiving an input voltage, and an output terminal for outputting a first voltage, where the inverting unit is used for inverting the input voltage to generate the first voltage. The at least one gain module has a input terminal coupled to the output terminal of the inverting unit for receiving the first voltage, and an output terminal for outputting an output voltage. Each gain module includes a first gain inverting unit and a second gain inverting unit. The first gain inverting unit is used for receiving the first voltage; and the second gain inverting unit is coupled to the first gain inverting unit for outputting the output voltage. The first gain inverting unit and the second gain inverting unit are used for dominating bandwidth of the high speed transimpedance amplifier, and a structure of the first gain inverting unit is the same as a structure of the second gain inverting unit. The feedback resistor is coupled to the input terminal of the inverting unit and the output terminal of the at least one gain module for determining transimpedance of the high speed transimpedance amplifier.

The present invention provides a high speed transimpedance amplifier. The high speed transimpedance amplifier utilizes a characteristic of resistive feedback to increase gain-bandwidth product of the high speed transimpedance amplifier. Therefore, under given bandwidth, a gain of the high speed transimpedance amplifier is much higher than a gain of a transimpedance amplifier provided by the prior art. Therefore, sensitivity of the high speed transimpedance amplifier is much better than sensitivity of the transimpedance amplifier provided by the prior art. In addition, if the sensitivity of the transimpedance amplifier is not the main design goal, transconductances of P-type metal-oxide-semiconductor transistors and N-type metal-oxide-semiconductor transistors of the transimpedance amplifier can be decreased.

Thus, power consumption of the transimpedance amplifier is much lower than power consumption of the transimpedance amplifier provided by the prior art.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
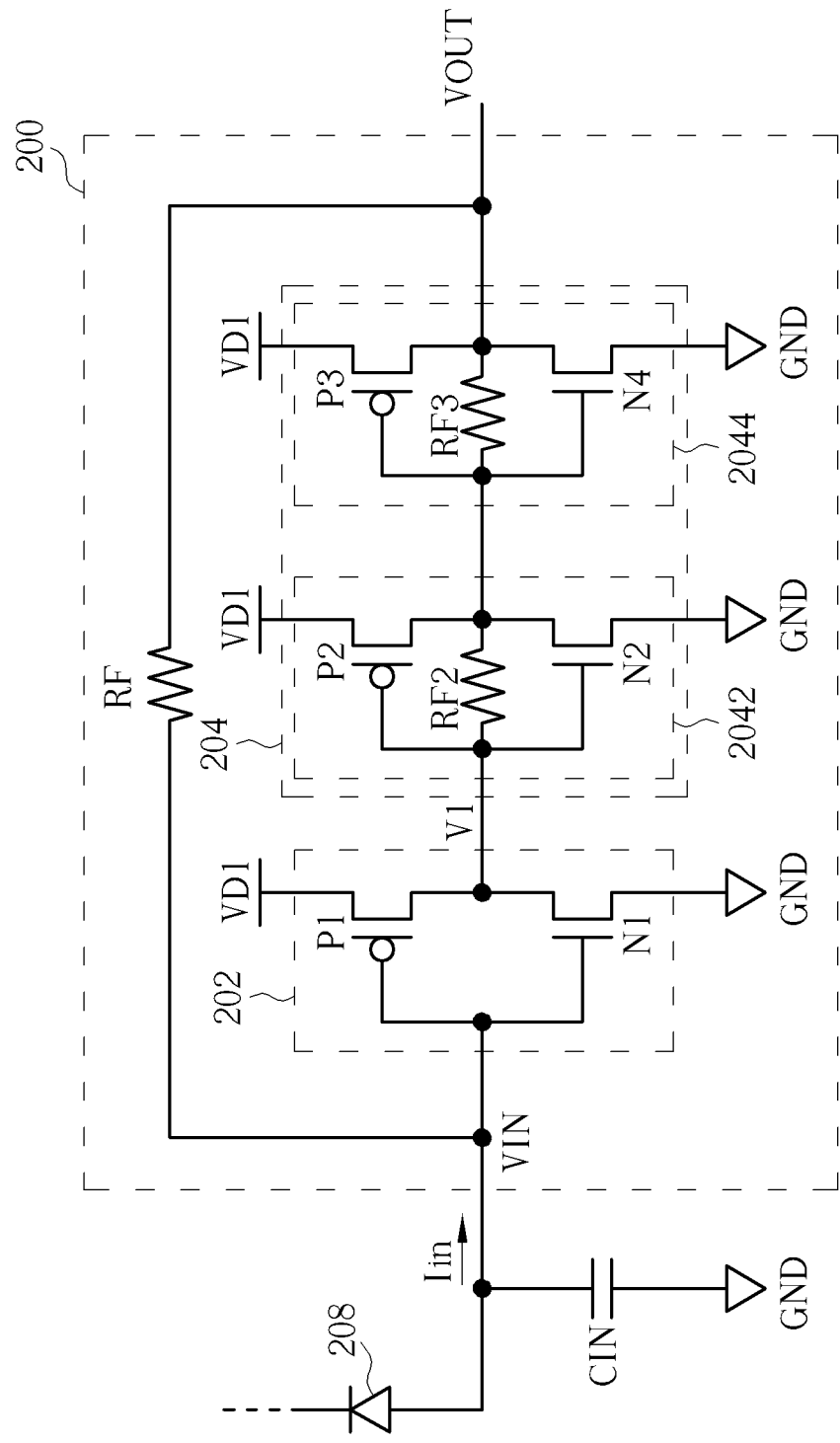
FIG. 2 is a diagram illustrating a high speed transimpedance amplifier according to an embodiment.

Please refer to FIG. 2. FIG. 2 is a diagram illustrating a high speed transimpedance amplifier 200 according to an embodiment. The high speed transimpedance amplifier 200 includes an inverting unit 202, a gain module 204, and a feedback resistor RF. But, the present invention is not limited to the high speed transimpedance amplifier 200 only including a gain module. That is to say, the high speed transimpedance amplifier 200 can include at least one gain module. The inverting unit 202 has an input terminal coupled to a photodiode 208 for receiving an input voltage VIN, and an output terminal for outputting a first voltage V1, where the inverting unit 202 is used for inverting the input voltage VIN to generate the first voltage V1. The gain module 204 has an input terminal coupled to the output terminal of the inverting unit 202 for receiving the first voltage V1, and an output terminal for outputting an output voltage VOUT. The gain module 204 includes a first gain inverting unit 2042 and a second gain inverting unit 2044. The first gain inverting unit 2042 is used for receiving the first voltage V1. The second gain inverting unit 2044 is coupled to the first gain inverting unit for outputting the output voltage VOUT. The first gain inverting unit 2042 and the second gain inverting unit 2044 are used for dominating bandwidth of the high speed transimpedance amplifier 200. The feedback resistor RF is coupled to the input terminal of the inverting unit 202 and the output terminal of the gain module 204 for determining transimpedance of the high speed transimpedance amplifier 200.

As shown in FIG. 2, the inverting unit 202 includes a first P-type metal-oxide-semiconductor transistor P1 and a first N-type metal-oxide-semiconductor transistor N1. The first P-type metal-oxide-semiconductor transistor P1 has a first terminal for receiving a first direct current voltage VD1, a second terminal coupled to the photodiode 208, and a third terminal for outputting the first voltage V1; and the first N-type metal-oxide-semiconductor transistor N1 has a first terminal coupled to the third terminal of the first P-type metal-oxide-semiconductor transistor P1, a second terminal coupled to the photodiode 208, and a third terminal coupled to the ground GND. The first gain inverting unit 2042 includes a second P-type metal-oxide-semiconductor transistor P2, a second N-type metal-oxide-semiconductor transistor N2, and a first feedback resistor RF2. The second P-type metal-oxide-semiconductor transistor P2 has a first terminal for receiving the first direct current voltage VD1, a second terminal coupled to the third terminal of the first P-type metal-oxide-semiconductor transistor P1 for receiving the first voltage V1, and a third terminal; the second N-type metal-oxide-semiconductor transistor N2 has a first terminal coupled to the third terminal of the second P-type metal-oxide-semiconductor transistor P2, a second terminal coupled to the third terminal of the first P-type metal-oxide-semiconductor transistor P1, and a third terminal coupled to the ground GND; and the first feedback resistor RF2 is coupled between the second terminal of the second P-type metal-oxide-semiconductor transistor P2 and the third terminal of the second P-type metal-oxide-semiconductor transistor P2. The second gain inverting unit 2044 includes a third P-type metal-oxide-semiconductor transistor P3, a fourth N-type metal-oxide-semiconductor transistor N4, and a second feedback resistor RF3. The third P-type metal-oxide-semiconductor transistor P3 has a first terminal for receiving the first direct current voltage VD1, a second terminal coupled to the third terminal of the second P-type metal-oxide-semiconductor transistor P2, and a third terminal for outputting the output voltage VOUT; the fourth N-type metal-oxide-semiconductor transistor N4 has a first terminal coupled to the third terminal of the third P-type metal-oxide-semiconductor transistor P3, a second terminal coupled to the third terminal of the second P-type metal-oxide-semiconductor transistor P2, and a third terminal coupled to the ground GND; and the second feedback resistor RF3 is coupled between the second terminal of the third P-type metal-oxide-semiconductor transistor P3 and the third terminal of the third P-type metal-oxide-semiconductor transistor P3.

As shown in FIG. 2, the inverting unit 202, the first gain inverting unit 2042 having the first feedback resistor RF2, and the second gain inverting unit 2044 having the second feedback resistor RF3 of the high speed transimpedance amplifier 200 form a three stage operational amplifier based on resistive feedback, where the first gain inverting unit 2042 and the second gain inverting unit 2044 can dominate the bandwidth of the high speed transimpedance amplifier 200. That is to say, only the first gain inverting unit 2042 and the second gain inverting unit 2044 can further improve a gain-bandwidth product of the high speed transimpedance amplifier 200. A gain A of the high speed transimpedance amplifier 200 can be determined by equation (6):

$$A = \frac{g_{mP3} + g_{mN3}}{g_{mP3} + g_{mN3} + g_{mP2} + g_{mN2}} \times \\ ((g_{mP1} + g_{mN1}) \times RF2) \times ((g_{mP2} + g_{mN2}) \times RF3) \quad (6)$$

As shown in equation (6), gmPi and gmNi represent transconductances of a P-type metal-oxide-semiconductor transistor Pi and an N-type metal-oxide-semiconductor transistor Ni, respectively, where $1 \leq i \leq 3$, and i is a positive integer.

Figure 1:
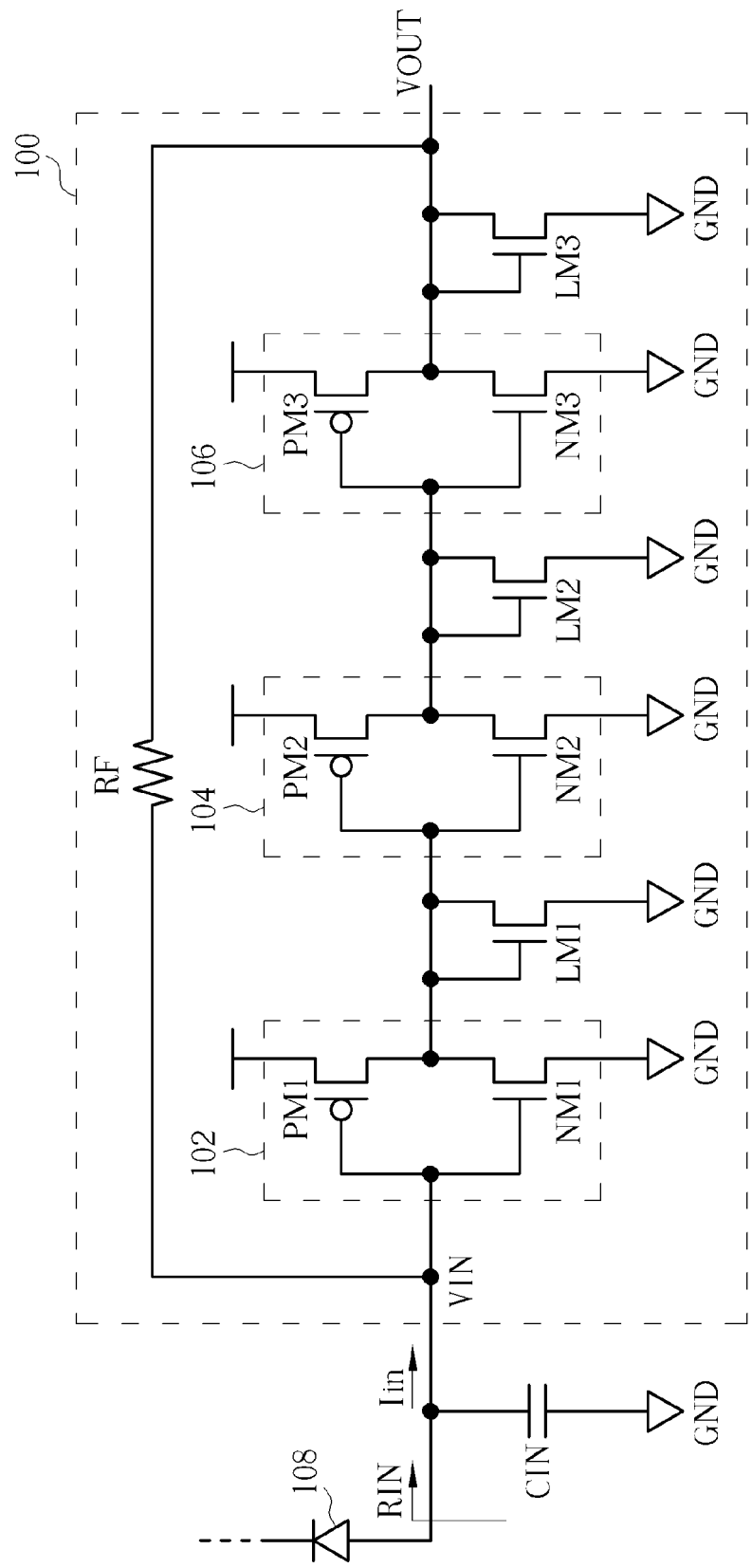
FIG. 1 is a diagram illustrating a transimpedance amplifier according to the prior art.

Because an operational amplifier based on the resistive feedback can increase a gain-bandwidth product of the operational amplifier, the gain-bandwidth product of the high speed transimpedance amplifier 200 is superior to a gain-bandwidth product of the transimpedance amplifier 100 in FIG. 1. For example, if the high speed transimpedance amplifier 200 is given fixed bandwidth, the gain A of the high speed transimpedance amplifier 200 is much higher than a gain of the transimpedance amplifier 100 in FIG. 1. Thus, the feedback resistor RF can be designed a resistor with a high resistance according to equation (4), resulting in input noise of the transimpedance amplifier 200 being decreased (according to equation (5)) and a transimpedance gain of the transimpedance amplifier 200 being increased (according to equation (3)). In addition, the input noise of the transimpedance amplifier 200 is decreased, so sensitivity of the transimpedance amplifier 200 is increased.

Figure 3:
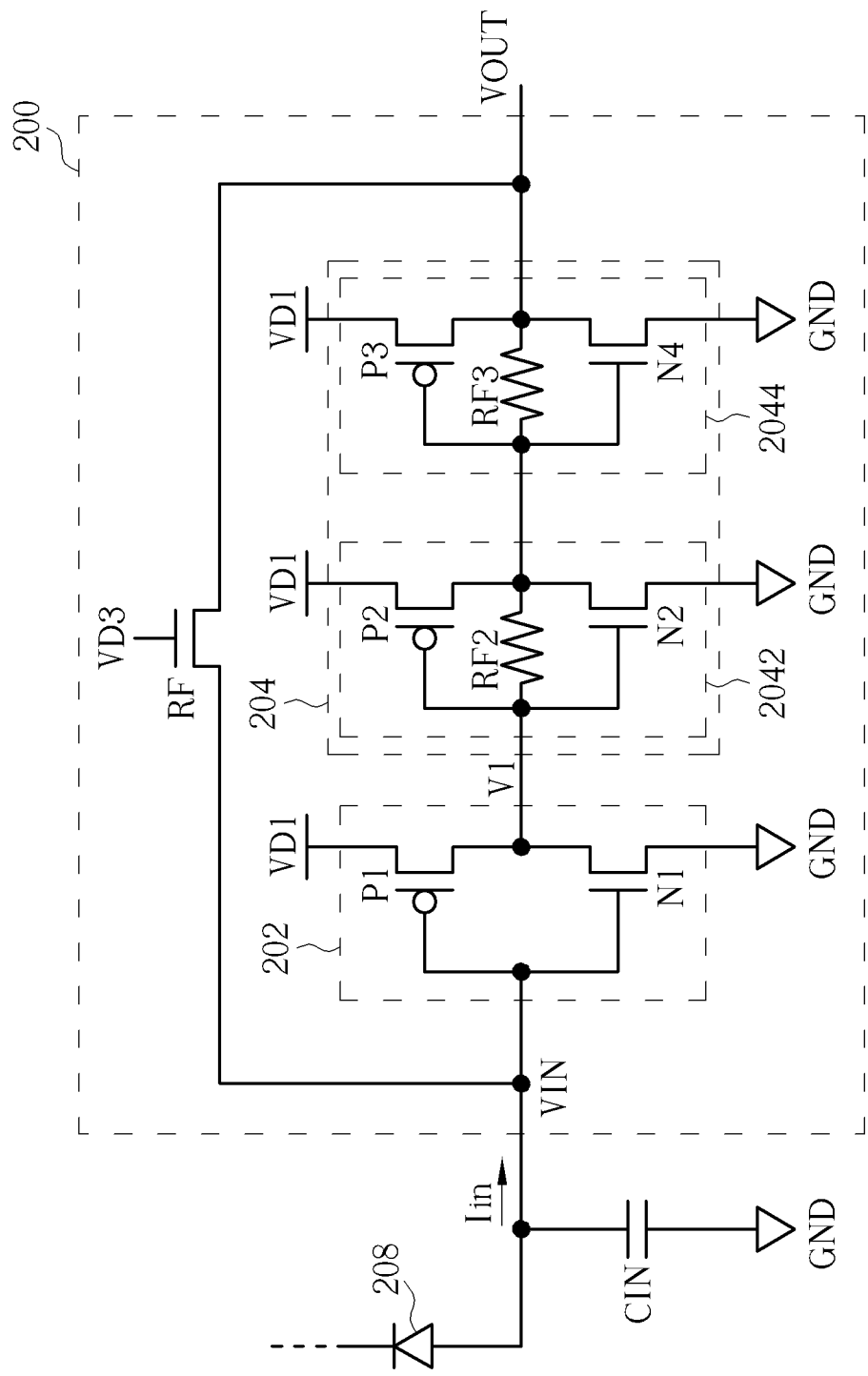
FIG. 3 is a diagram illustrating a high speed transimpedance amplifier according to another embodiment.

If the sensitivity of the transimpedance amplifier 200 is not the main design goal, transconductance of a P-type metal-oxide-semiconductor transistor Pi and an N-type metal-oxide-semiconductor transistor Ni of the transimpedance amplifier 200 can be decreased, resulting in current consumption of the transimpedance amplifier 200 being decreased (because transconductance of a metal-oxide-semiconductor transistor is proportional to current consumption of the metal-oxide-semiconductor transistor to the power of (½)). Thus, power consumption of the transimpedance amplifier 200 is significantly decreased. In addition, in another embodiment of the present invention, the feedback resistor RF is a metal-oxide-semiconductor transistor resistor (as shown in FIG. 3) controlled by a third direct current voltage VD3.

Figure 4:
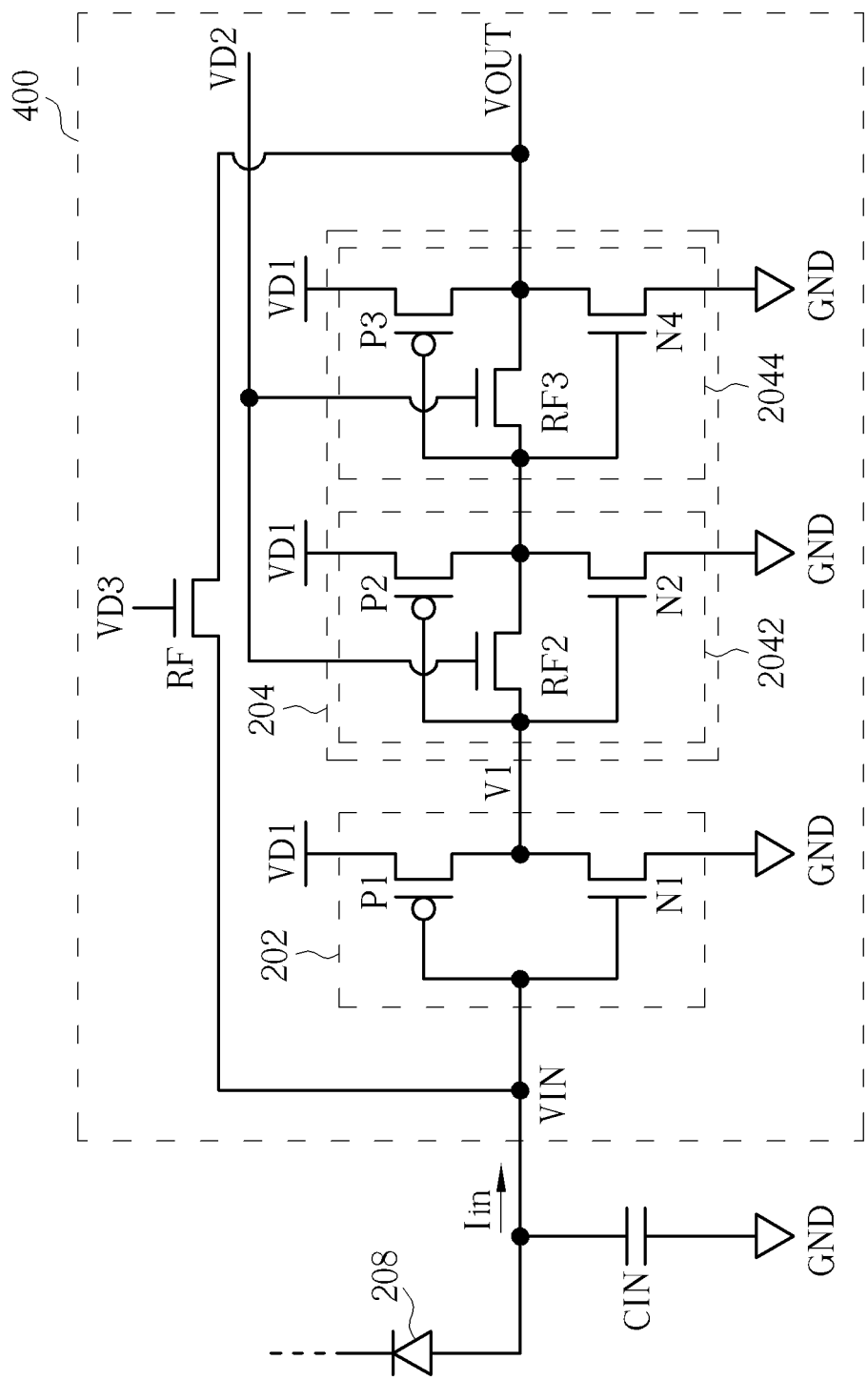
FIG. 4 is a diagram illustrating a high speed transimpedance amplifier according to another embodiment.

Please refer to FIG. 4. FIG. 4 is a diagram illustrating a high speed transimpedance amplifier 400 according to another embodiment. As shown in FIG. 4, a difference between the high speed transimpedance amplifier 400 and the high speed transimpedance amplifier 200 in FIG. 2 is that a first feedback resistor RF2, a second feedback resistor RF3, and a feedback resistor RF of the high speed transimpedance amplifier 400 are N-type metal-oxide-semiconductor transistors. But, the present invention is not limited to the first feedback resistor RF2, the second feedback resistor RF3, and the feedback resistor RF being N-type metal-oxide-semiconductor transistors. That is to say, the first feedback resistor RF2, the second feedback resistor RF3, and the feedback resistor RF can be also P-type metal-oxide-semiconductor transistors. As shown in FIG. 4, the first feedback resistor RF2 has a first terminal coupled to the second terminal of the second P-type metal-oxide-semiconductor transistor P2, a second terminal coupled to the third terminal of the second P-type metal-oxide-semiconductor transistor P2, and a third terminal for receiving a second direct current voltage VD2; the second feedback resistor RF3 has a first terminal coupled to the second terminal of the third P-type metal-oxide-semiconductor transistor P3, a second terminal coupled to the third terminal of the third P-type metal-oxide-semiconductor transistor P3, and a third terminal for receiving the second direct current voltage VD2; and the feedback resistor RF has a first terminal coupled to the second terminal of the first P-type metal-oxide-semiconductor transistor P1, a second terminal coupled to the third terminal of the third P-type metal-oxide-semiconductor transistor P3, and a third terminal for receiving a third direct current voltage VD3. In addition, subsequent operational principles of the high speed transimpedance amplifier 400 are the same as those of the high speed transimpedance amplifier 200, so further description thereof is omitted for simplicity.

Figure 5:
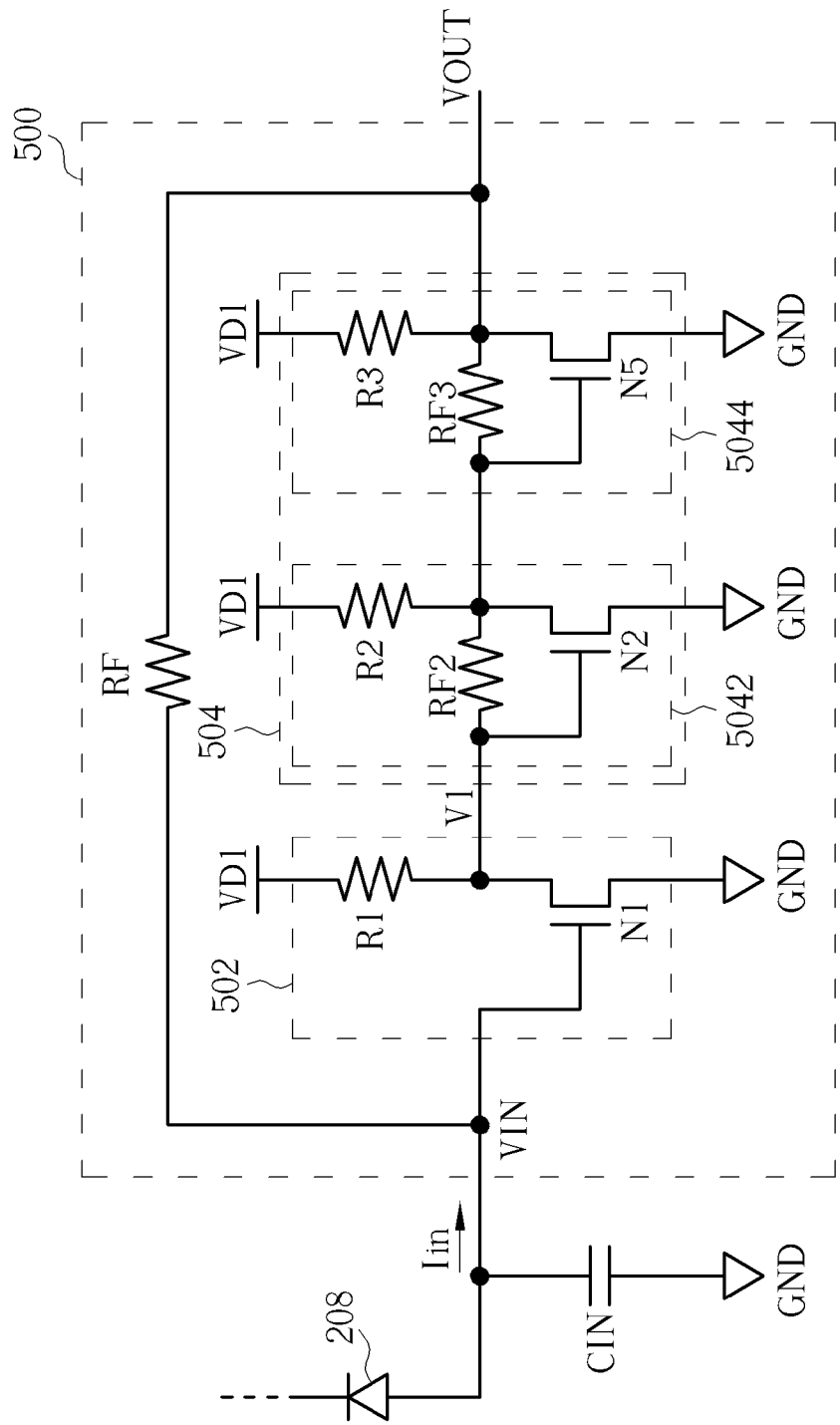
FIG. 5 is a diagram illustrating a high speed transimpedance amplifier according to another embodiment.

Please refer to FIG. 5. FIG. 5 is a diagram illustrating a high speed transimpedance amplifier 500 according to another embodiment. As shown in FIG. 5, a difference between the high speed transimpedance amplifier 500 and the high speed transimpedance amplifier 200 in FIG. 2 is that the high speed transimpedance amplifier 500 utilizes N-type metal-oxide-semiconductor transistor inverters to substitute for the inverting unit 202, the first gain inverting unit 2042, and the second gain inverting unit 2044 of the high speed transimpedance amplifier 200 in FIG. 2. As shown in FIG. 5, an inverting unit 502 includes a first resistor R1, and a first N-type metal-oxide-semiconductor transistor N1. The first resistor R1 has a first terminal for receiving a first direct current voltage VD1, and a second terminal for outputting a first voltage V1; and the first N-type metal-oxide-semiconductor transistor N1 has a first terminal coupled to the second terminal of the first resistor R1, a second terminal coupled to the photodiode 208, and a third terminal coupled to the ground GND. A gain module 504 includes a first gain inverting unit 5042, and a second gain inverting unit 5044. The first gain inverting unit 5042 includes a second resistor R2, a second N-type metal-oxide-semiconductor transistor N2, and a first feedback resistor RF2. The second resistor R2 has a first terminal for receiving the first direct current voltage VD1, and a second terminal coupled to the second gain inverting unit 5044; the second N-type metal-oxide-semiconductor transistor N2 has a first terminal coupled to the second terminal of the second resistor R2, a second terminal coupled to the second terminal of the first resistor R1, and a third terminal coupled to the ground GND; and the first feedback resistor RF2 is coupled between the second terminal of the second resistor R2 and the second terminal of the second N-type metal-oxide-semiconductor transistor N2. The second gain inverting unit 5044 includes a third resistor R3, a fifth N-type metal-oxide-semiconductor transistor N5, and a second feedback resistor RF3. The third resistor R3 has a first terminal for receiving the first direct current voltage VD1, and a second terminal coupled to the feedback resistor RF; the fifth N-type metal-oxide-semiconductor transistor N5 has a first terminal coupled to the second terminal of the third resistor R3, a second terminal coupled to the second terminal of the second resistor R2, and a third terminal coupled to the ground GND; and the second feedback resistor RF3 is coupled between the second terminal of the third resistor R3 and the second terminal of the fifth N-type metal-oxide-semiconductor transistor N5. In addition, subsequent operational principles of the high speed transimpedance amplifier 500 are the same as those of the high speed transimpedance amplifier 200, so further description thereof is omitted for simplicity.

Figure 6:
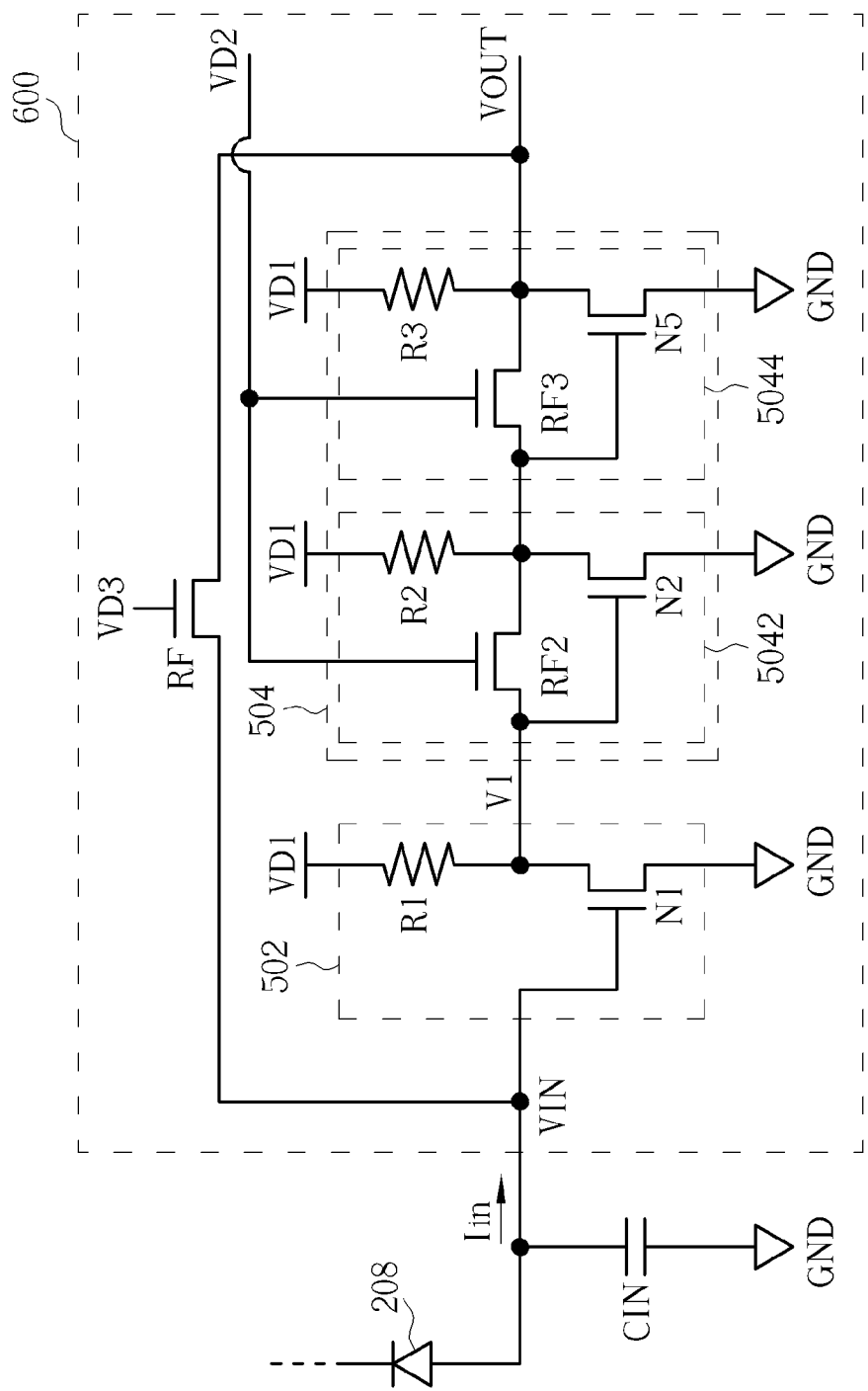
FIG. 6 is a diagram illustrating a high speed transimpedance amplifier according to another embodiment.

Please refer to FIG. 6. FIG. 6 is a diagram illustrating a high speed transimpedance amplifier 600 according to another embodiment. A difference between the high speed transimpedance amplifier 600 and the high speed transimpedance amplifier 500 in FIG. 5 is that a first feedback resistor RF2, a second feedback resistor RF3, and a feedback resistor RF of the high speed transimpedance amplifier 600 are N-type metal-oxide-semiconductor transistors. But, the present invention is not limited to the first feedback resistor RF2, the second feedback resistor RF3, and the feedback resistor RF being N-type metal-oxide-semiconductor transistors. That is to say, the first feedback resistor RF2, the second feedback resistor RF3, and the feedback resistor RF can be also P-type metal-oxide-semiconductor transistors. As shown in FIG. 6, the first feedback resistor RF2 has a first terminal coupled to the second terminal of the second N-type metal-oxide-semiconductor transistor N2, a second terminal coupled to the second terminal of the second resistor R2, and a third terminal for receiving a second direct current voltage VD2; the first feedback resistor RF3 has a first terminal coupled to the second terminal of the fifth N-type metal-oxide-semiconductor transistor N5, a second terminal coupled to the second terminal of the third resistor R3, and a third terminal for receiving the second direct current voltage VD2; and the feedback resistor RF has a first terminal coupled to the second terminal of the first N-type metal-oxide-semiconductor transistor N1, a second terminal coupled to the first terminal of the fifth N-type metal-oxide-semiconductor transistor N5, and a third terminal for receiving a third direct current voltage VD3.

In addition, subsequent operational principles of the high speed transimpedance amplifier 600 are the same as those of the high speed transimpedance amplifier 500, so further description thereof is omitted for simplicity.

To sum up, the high speed transimpedance amplifier utilizes a characteristic of the resistive feedback to increase gain-bandwidth product of the high speed transimpedance amplifier. Therefore, under given bandwidth, a gain of the high speed transimpedance amplifier is much higher than a gain of a transimpedance amplifier provided by the prior art. Therefore, sensitivity of the high speed transimpedance amplifier is much better than sensitivity of the transimpedance amplifier provided by the prior art. In addition, if the sensitivity of the transimpedance amplifier is not the main design goal, transconductances of P-type metal-oxide-semiconductor transistors and N-type metal-oxide-semiconductor transistors of the transimpedance amplifier can be decreased. Thus, power consumption of the transimpedance amplifier is much lower than power consumption of the transimpedance amplifier provided by the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high speed transimpedance amplifier, comprising:
   an inverting unit having an input terminal coupled to a photodiode for receiving an input voltage, and an output terminal for outputting a first voltage, wherein the inverting unit comprises:
      a first resistor having a first terminal for receiving a first direct current voltage, and a second terminal for outputting the first voltage; and
      a first N-type metal-oxide-semiconductor transistor having a first terminal coupled to the second terminal of the first resistor, a second terminal coupled to the photodiode, and a third terminal coupled to ground;
   at least one gain module having an input terminal coupled to the output terminal of the inverting unit for receiving the first voltage, and an output terminal for outputting an output voltage, wherein each gain module comprises:
      a first gain inverting unit for receiving the first voltage; and
      a second gain inverting unit coupled to the first gain inverting unit for outputting the output voltage, wherein the first gain inverting unit and the second gain inverting unit are used for dominating bandwidth of the high speed transimpedance amplifier; and
   a feedback resistor coupled to the input terminal of the inverting unit and the output terminal of the at least one gain module for determining transimpedance of the high speed transimpedance amplifier.

2. The high speed transimpedance amplifier of claim 1, wherein the first gain inverting unit comprises:
   a first P-type metal-oxide-semiconductor transistor having a first terminal for receiving a first direct current voltage, a second terminal coupled to the inverting unit for receiving the first voltage, and a third terminal coupled to the second gain inverting unit;
   a second N-type metal-oxide-semiconductor transistor having a first terminal coupled to the third terminal of the first P-type metal-oxide-semiconductor transistor, a second terminal coupled to the inverting unit, and a third terminal coupled to ground; and
   a first feedback resistor coupled between the second terminal of the first P-type metal-oxide-semiconductor transistor and the third terminal of the first P-type metal-oxide-semiconductor transistor.

3. The high speed transimpedance amplifier of claim 2, wherein the first feedback resistor is a third N-type metal-oxide-semiconductor transistor, and the third N-type metal-oxide-semiconductor transistor has a first terminal coupled to the second terminal of the first P-type metal-oxide-semiconductor transistor, a second terminal coupled to the third terminal of the first P-type metal-oxide-semiconductor transistor, and a third terminal for receiving a second direct current voltage.

4. The high speed transimpedance amplifier of claim 3, wherein the feedback resistor is a fourth N-type metal-oxide-semiconductor transistor, and the fourth N-type metal-oxide-semiconductor transistor has a first terminal coupled to the input terminal of the inverting unit, a second terminal coupled to the output terminal of the at least one gain module, and a third terminal for receiving a third direct current voltage.

5. The high speed transimpedance amplifier of claim 4, wherein the second gain inverting unit comprises:
   a second P-type metal-oxide-semiconductor transistor having a first terminal for receiving a first direct current voltage, a second terminal coupled to the first gain inverting unit, and a third terminal coupled to the feedback resistor;
   a fifth N-type metal-oxide-semiconductor transistor having a first terminal coupled to the third terminal of the second P-type metal-oxide-semiconductor transistor, a second terminal coupled to the first gain inverting unit, and a third terminal coupled to ground; and
   a second feedback resistor coupled between the second terminal of the second P-type metal-oxide-semiconductor transistor and the third terminal of the second P-type metal-oxide-semiconductor transistor.

6. The high speed transimpedance amplifier of claim 5, wherein the second feedback resistor is a sixth N-type metal-oxide-semiconductor transistor, and the sixth N-type metal-oxide-semiconductor transistor has a first terminal coupled to the second terminal of the second P-type metal-oxide-semiconductor transistor, a second terminal coupled to the third terminal of the second P-type metal-oxide-semiconductor transistor, and a third terminal for receiving a second direct current voltage.

7. The high speed transimpedance amplifier of claim 1, wherein the first gain inverting unit comprises:
   a second resistor having a first terminal for receiving the first direct current voltage, and a second terminal coupled to the second gain inverting unit;
   a second N-type metal-oxide-semiconductor transistor having a first terminal coupled to the second terminal of the second resistor, a second terminal coupled to the inverting unit, and a third terminal coupled to the ground; and
   a first feedback resistor coupled between the second terminal of the second resistor and the second terminal of the second N-type metal-oxide-semiconductor transistor.

8. The high speed transimpedance amplifier of claim 7, wherein the first feedback resistor is a third N-type metal-oxide-semiconductor transistor, and the third N-type metal-oxide-semiconductor transistor has a first terminal coupled to the second terminal of the second N-type metal-oxide-semiconductor transistor, a second terminal coupled to the second terminal of the second resistor, and a third terminal for receiving a second direct current voltage.

9. The high speed transimpedance amplifier of claim 8, wherein the feedback resistor is a fourth N-type metal-oxide-semiconductor transistor, and the fourth N-type metal-oxidesemiconductor transistor has a first terminal coupled to the input terminal of the inverting unit, a second terminal coupled to the output terminal of the at least one gain module, and a third terminal for receiving a third direct current voltage.

10. The high speed transimpedance amplifier of claim 9, wherein the second gain inverting unit comprises:
   a third resistor having a first terminal for receiving the first direct current voltage, and a second terminal coupled to the feedback resistor;
   a fifth N-type metal-oxide-semiconductor transistor having a first terminal coupled to the second terminal of the third resistor, a second terminal coupled to the first gain inverting unit, and a third terminal coupled to the ground; and
   a second feedback resistor coupled between the second terminal of the third resistor and the second terminal of the fifth N-type metal-oxide-semiconductor transistor.

11. The high speed transimpedance amplifier of claim 10, wherein the second feedback resistor is a sixth N-type metal-oxide-semiconductor transistor, and the sixth N-type metal-oxide-semiconductor transistor has a first terminal coupled to the second terminal of the fifth N-type metal-oxide-semiconductor transistor, a second terminal coupled to the second terminal of the third resistor, and a third terminal for receiving a second direct current voltage.

* * * * *